(12) United States Patent  
Donlan et al.

(10) Patent No.: US 9,098,447 B1  
(45) Date of Patent: *Aug. 4, 2015

(54) RECOVERY OF CORRUPTED ERASURE-CODED DATA FILES

(71) Applicant: Amazon Technologies, Inc., Seattle, WA (US)

(72) Inventors: Bryan James Donlan, Seattle, WA (US); Paul David Franklin, Lake Forest Park, WA (US)

(73) Assignee: Amazon Technologies, Inc., Seattle, WA (US)

( * ) Notice: Subject to any disclaimer, the term of this patent is extended or adjusted under 35 U.S.C. 154(b) by 150 days.

This patent is subject to a terminal disclaimer.

(21) Appl. No.: 13/898,071

(22) Filed: May 20, 2013

(51) Int. Cl.  
*G06F 11/14* (2006.01)  
*H03M 13/29* (2006.01)  
*H03M 13/37* (2006.01)  
(Continued)

(52) U.S. Cl.  
CPC ........... *G06F 11/1412* (2013.01); *H03M 13/03* (2013.01); *H03M 13/09* (2013.01); *H03M 13/1102* (2013.01); *H03M 13/1111* (2013.01); *H03M 13/1191* (2013.01); *H03M 13/15* (2013.01); *H03M 13/1515* (2013.01); *H03M 13/293* (2013.01); *H03M 13/2906* (2013.01); *H03M 13/35* (2013.01); *H03M 13/356* (2013.01); *H03M 13/373* (2013.01);  
(Continued)

(58) Field of Classification Search  
CPC . H03M 13/293; H03M 13/373; H03M 13/03; H03M 13/09; H03M 13/1102; H03M 13/15; H03M 13/1515; H03M 13/2906; H03M 13/356; H03M 13/3761; H03M 13/6356; H03M 13/6362; H03M 13/1111; H03M 13/1191; H03M 13/35

USPC ......... 714/776, 746, 752, 758, 763, 800, 769, 714/755, 784, 786, 795, 799, 6.1, 6.2, 6.24, 714/54; 711/104, 111, 114; 707/697, 699  
See application file for complete search history.

(56) References Cited

U.S. PATENT DOCUMENTS 6,738,380 B1 * 5/2004 Imai et al. ................ 370/395.42  
8,504,535 B1 * 8/2013 He et al. ........................ 707/695  
(Continued)

OTHER PUBLICATIONS

Hendricks, Efficient Byzantine Fault Tolerance for Scalable Storage and Services, Jul. 2009, School of Computer Science Carnegie Mellon University Pittsburgh, PA 15213, pp. v., 1-111.*

(Continued)

*Primary Examiner* — John J Tabone, Jr.  
(74) *Attorney, Agent, or Firm* — Lee & Hayes, PLLC; Charles L. Warner

(57) ABSTRACT

If none of the fragments of an erasure-coded data file have become corrupted then the original data file can be readily reconstructed. If one or more fragments of an erasure-coded data file have become corrupted it may still be possible to find a combination of fragments that reconstruct the original data file, but the number of possible combinations may be impracticably large. If an attempt with a first set of fragments fails, an efficient approach is to use an independent set of fragments for the second attempt. Then, for further attempts, the results of a current attempt are compared with previous results. If a match is found then the original data file has been reconstructed. An original data file may also be reconstructed by separately recovering each data block of the data file from corresponding fragment blocks and assembling the data file from the recovered data blocks.

22 Claims, 12 Drawing Sheets

(51) Int. Cl.
*H03M 13/03* (2006.01)
*H03M 13/09* (2006.01)
*H03M 13/15* (2006.01)
*H03M 13/11* (2006.01)
*H03M 13/00* (2006.01)
*H03M 13/35* (2006.01)

(52) U.S. Cl.
CPC ...... *H03M13/3761* (2013.01); *H03M 13/6356* (2013.01); *H03M 13/6362* (2013.01)

(56) References Cited

U.S. PATENT DOCUMENTS

| | | | | |
|---|---|---|---|---|
| 8,522,109 | B2* | 8/2013 | Murakami et al. | 714/755 |
| 8,806,296 | B1* | 8/2014 | Lazier | 714/763 |
| 8,850,288 | B1* | 9/2014 | Lazier et al. | 714/763 |
| 8,869,001 | B1* | 10/2014 | Lazier | 714/755 |
| 2006/0080574 | A1* | 4/2006 | Saito et al. | 714/11 |
| 2006/0155946 | A1* | 7/2006 | Ji | 711/162 |
| 2008/0221856 | A1* | 9/2008 | Dubnicki et al. | 703/21 |
| 2009/0222585 | A1* | 9/2009 | Khalil et al. | 709/246 |
| 2010/0094986 | A1* | 4/2010 | Zuckerman et al. | 709/223 |
| 2010/0095012 | A1 | 4/2010 | Zuckerman et al. | |
| 2010/0095184 | A1* | 4/2010 | Zuckerman et al. | 714/751 |
| 2010/0100587 | A1* | 4/2010 | Teglovic et al. | 709/203 |
| 2010/0174968 | A1* | 7/2010 | Charles et al. | 714/781 |
| 2011/0029711 | A1* | 2/2011 | Dhuse et al. | 711/4 |
| 2011/0029742 | A1* | 2/2011 | Grube et al. | 711/154 |
| 2011/0029809 | A1* | 2/2011 | Dhuse et al. | 714/6 |
| 2011/0087948 | A1* | 4/2011 | Murakami et al. | 714/758 |
| 2011/0197106 | A1* | 8/2011 | Kishigami et al. | 714/755 |
| 2013/0061116 | A1* | 3/2013 | Grube et al. | 714/784 |
| 2013/0204849 | A1* | 8/2013 | Chacko | 707/692 |
| 2014/0344531 | A1* | 11/2014 | Lazier | 711/154 |

OTHER PUBLICATIONS

Nychis et al., Analysis of Erasure Coding in a Peer to Peer Backup System, May 2006, Carnegie Mellon University, pp. 1-13.*

Huang, C. et al., "Erasure Coding in Windows Azure Storage", Microsoft Corporation [online][retrieved on: May 22, 2013] retrieved from: http://research.microsoft.com/pubs/179583/LRC12-cheng%20webpage.pdf, 12 pps.

Weatherspoon, H. et al., "Erasure Coding vs. Replication: A Quantitative Comparison", Computer Science Division, University of California, Berkeley [online][retrieved on: May 22, 2013] retrieved from: http://www.cs.rice.edu/Conferences/IPTPS02/170.pdf, 11 pps.

Hendricks, J. et al., "Verifying Distributed Erasure-Coded Data", PODS 2007, Aug. 12-15, 2007, Portland, Oregon, US [online][retrieved on: May 22, 2013] retrieved from: http://www.pdl.cmu.edu/PDL-FTP/SelfStar/podc07.pdf, pp. 139-145.

Luo et al. "An Efficient XOR-Scheduling Algorithm for Erasure Codes Encoding", Publisher: IEEE, published in Dependable Systems & Networks, 2009, IEEE/IFIP Int'l Conference, Lisbon, Jun. 29, 2009-Jul. 2, 2009, pp. 504-513.

Office action for U.S. Appl. No. 13/898,066, mailed on Dec. 18, 2014, Donlan et al., "Recovery of Corrupted Erasure-Coded Data Files", 10 pages.

Office action for U.S. Appl. No. 13/925,497, mailed on Dec. 19, 2014, Franklin et al., "Cross-Region Recovery of Encrypted, Erasure-Encoded Data", 14 pages.

* cited by examiner

RECOVERY OF CORRUPTED ERASURE-CODED DATA FILES

RELATED APPLICATION DATA

This application is related to U.S. patent application Ser. No. 13/898,066, filed on the same date herewith, also entitled "Recovery Of Corrupted Erasure-Coded Data Files".

BACKGROUND

Data files, such as but not limited to pictures, documents, spreadsheets, videos, sound recordings, presentations, scans, etc., are important to businesses, governments, and individuals. These data files are often stored on personal computers, laptops, small (local) servers, or other similar devices. Lightning, fire, flood, theft, a hard drive error or failure, or other unfortunate event can, however, render some or all of the data difficult or impossible to recover from those devices.

To provide for recovery of data in the event that it is no longer available from the various types of devices mentioned above, it is not uncommon for the data to be backed up via a distributed storage system, which may include, for example, different media and/or multiple servers, which may be geographically distributed and/or on, for example, a server farm. The different media, however, can be lost, stolen or damaged, or a server might suffer a problem, such as a hard drive error or failure.

One approach for providing for redundancy in storage of the data files is placing a copy of a data file on multiple server computers. This approach works, but can be expensive as the total storage space required is the size of the original data file multiplied by the number of servers on which the file is stored. Another approach is to use erasure coding, with the erasure coded information being stored on the several servers. Erasure coding can reduce the size of the storage space required for reliable storage of a file when compared to the space required for storing a complete copy of the data file on multiple servers.

Erasure coding breaks a data file into n fragments and generates a mathematical construct for each fragment. Not all n fragments are required, however, in order to reconstruct the original data file. For example, in an m-of-n erasure coding scheme, a data file is broken into n fragments, each fragment being 1/m the size of the data file, the fragments are encoded, and different fragments may be placed on different servers. When it is desired to reconstruct the data file, only m non-identical fragments are required to accurately construct the original data file.

If a data file is reconstructed from several fragments, but one of the fragments has become corrupted, the reconstructed data file generally will not be a faithful reconstruction of the original data file. Such corruption can often be detected by comparing checksums of the original data file and the reconstructed data file. For example, once a data file has been reconstructed from fragments, the checksum for the original file is retrieved and compared with the checksum for the reconstructed data file. If the checksums match, then the reconstructed data file is most likely a faithful reconstruction of the original data file. If the checksums do not match then corruption has occurred. The corruption, however, may be in the reconstructed data file, or may be in the original checksum that was stored and retrieved.

If corruption is detected, then one approach is to keep trying combinations of fragments until a combination yields a reconstructed data file with the correct checksum. This, however, may involve substantial computing time as there is potentially a factorial combination of fragments to try to reconstruct the block, that is, $$\binom{n}{m}$$

combinations. For example, in a 3-of-6 erasure coding scheme, there are 20 possible fragment combinations, in a 4-of-7 scheme there are 35 possible combinations, and in a 5-of-10 scheme there are 252 possible combinations. Some systems use large n values, 20, 40, or higher, and so the number of possible combinations becomes very large, and the approach of trying all possible combinations quickly becomes impractical. Also, if the corruption is in the original checksum value, then it is likely that none of the numerous candidate files will provide a checksum that matches this corrupted checksum, even if one, more, or all of the candidate data files is actually valid.

It is with respect to these and other considerations that the disclosure presented herein has been made.

DETAILED DESCRIPTION

Figure 1:
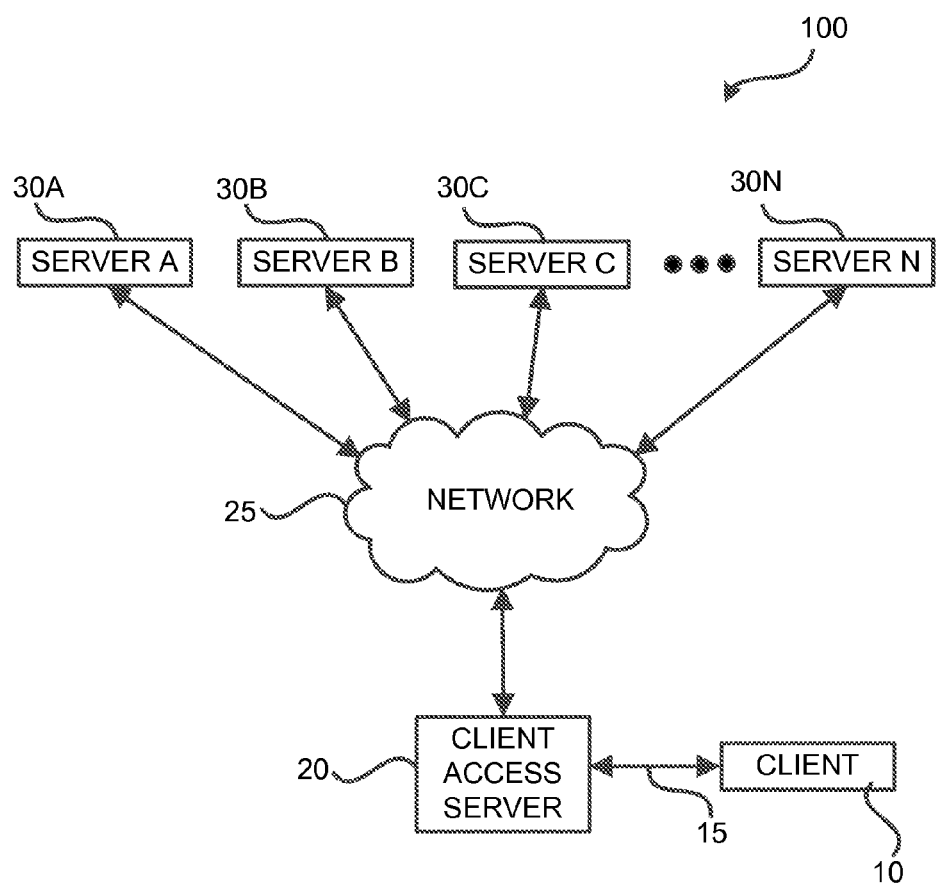
FIG. 1 is a network diagram showing one exemplary distributed computing system that can receive, store, recover, and send data files based on erasure-coded data.

The following detailed description is directed to concepts and technologies for recovering erasure-coded data. Thus, briefly stated, in a computing system that uses erasure-coding for the storage of data files, if a first attempt to construct the original data file from a first set of fragments is unsuccessful, then a second attempt is made using a second, independent set of fragments. If that is unsuccessful, then a repeating process is used whereby a new set of fragments is selected, a candidate data file is generated, and the candidate data file is compared with any previously generated candidate data files. If a match is found, then the original data file has been recovered. If all the combinations of fragments have been attempted without success then a data block recovery approach is attempted.

A technique for selecting the fragments in a set to be used to generate candidate data files improves the efficiency of the recovery process when one or more fragments is corrupted.

Each set of fragments is as independent as possible with respect to a previous set of fragments; that is, it are as few common fragments as possible.

In the data block recovery approach a data block is selected, a first set of fragments is selected, and the corresponding fragment blocks of the first set are used to construct a first candidate data block. Then, a second set of fragments is selected, and the corresponding fragment blocks of the second set are used to construct a second candidate data block. If the candidate data blocks match then the original data block has been recovered. If there is not a match, then a repeating process is used whereby a new set of fragments is selected, a candidate data block is generated, and that new candidate data block is compared with previously-generated candidate data blocks. If a match is found, then the original data block has been recovered. The next data block is then identified and the process is repeated. If all of the data blocks can be recovered, then they are used to reconstruct the original data file and new erasure-coded fragments can be generated from the reconstructed data file.

While the subject matter described herein is presented in the general context of program modules that execute in conjunction with the execution of an operating system and application programs on a computer system, those skilled in the art will recognize that other implementations may be performed in combination with other types of program modules. Generally, program modules include routines, programs, components, data structures, and other types of structures that perform particular tasks or implement particular abstract data types.

In the following detailed description, references are made to the accompanying drawings that form a part hereof, and in which are shown by way of illustration specific embodiments or examples. Referring now to the drawings, in which like numerals represent like elements throughout the several figures, aspects of a method for the efficient recovery of erasure-coded data files which have become corrupted will be presented.

FIG. 1 is an illustration of an exemplary distributed computing system 100 that can receive, store, recover, and send data files based on erasure-coded data. In the example system 100 shown in FIG. 1, a client has a data file that the client wishes to have backed up at a location other than at the client site. In order to accomplish this, a client computer 10 connects with a client access server 20, client access gateway, or client access portal via a connection 15, and sends the data file to the client access server 20.

In response to receiving the data file, the client access server 20 erasure-codes the data file using, for example, an m-of-n system such as those described above, and distributes the n fragments over a network 25 to a multitude of servers 30A-30N for storage. There could be only two servers 30 with each server storing m of the n fragments, n servers with each server storing one of the n fragments, more than n servers with some of the fragments being duplicated across two or more servers, or even k servers with each server storing n/k fragments, where n/k is not less than n-m. Typically, a client would send multiple data files to the client access server 20 for storage.

Suppose now that the client computer 10 suffers a hard drive failure, from which the data file cannot be recovered, or suffers from some other event that destroys the data file on the client computer 10. The client will then use a client computer 10 to request that the client access server 20 retrieve and provide those stored data files to the client computer 10. For each data file, the client access server 20 will then request that the various servers 30 provide the fragments for that file to the client access server 20. The client access server 20 will then use the fragments to reconstruct the data file. The client access server 20 will then send the reconstructed data file(s) to the client computer 10.

The connection 15 may be any desired connection or connections that provide the desired security, data speed, cost of service, etc., such as, but not limited to, the Internet. The network 25 is preferably a secure, internal data network but can be the Internet or any desired connection, or connections, that provide the desired security, data speed, cost of service, etc. The connection 15 and the network 25 may be the same or share one or more connections. Although the data file reconstruction is described herein as being performed by the client access server 20, the data file reconstruction can also be performed by one of the servers 30A-30N, by the client computer 10, or by another computing device.

Figure 2A:
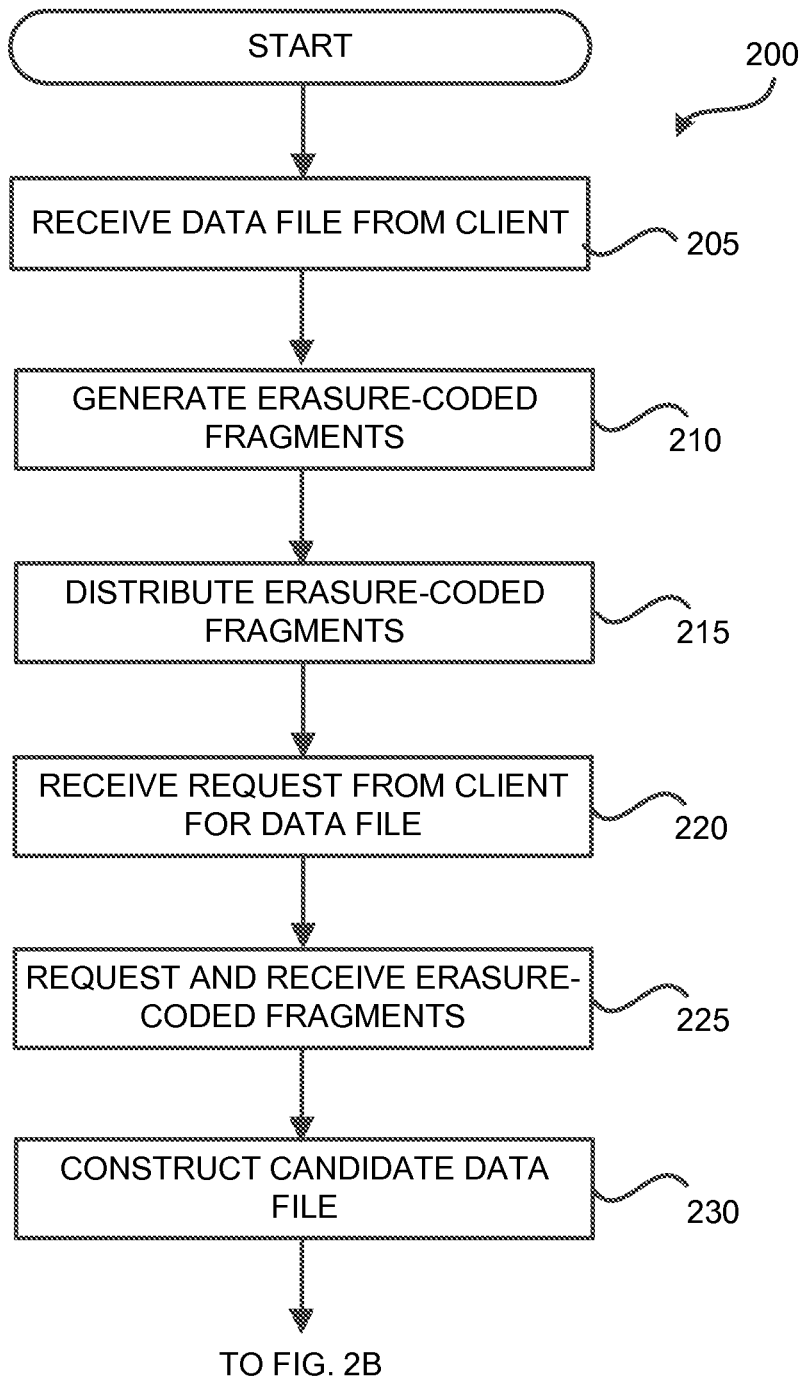
FIGS. 2A-2B are flow diagrams showing one illustrative routine performed by a client access server to reconstruct a data file from erasure-coded fragments for that data file.
Figure 2B:
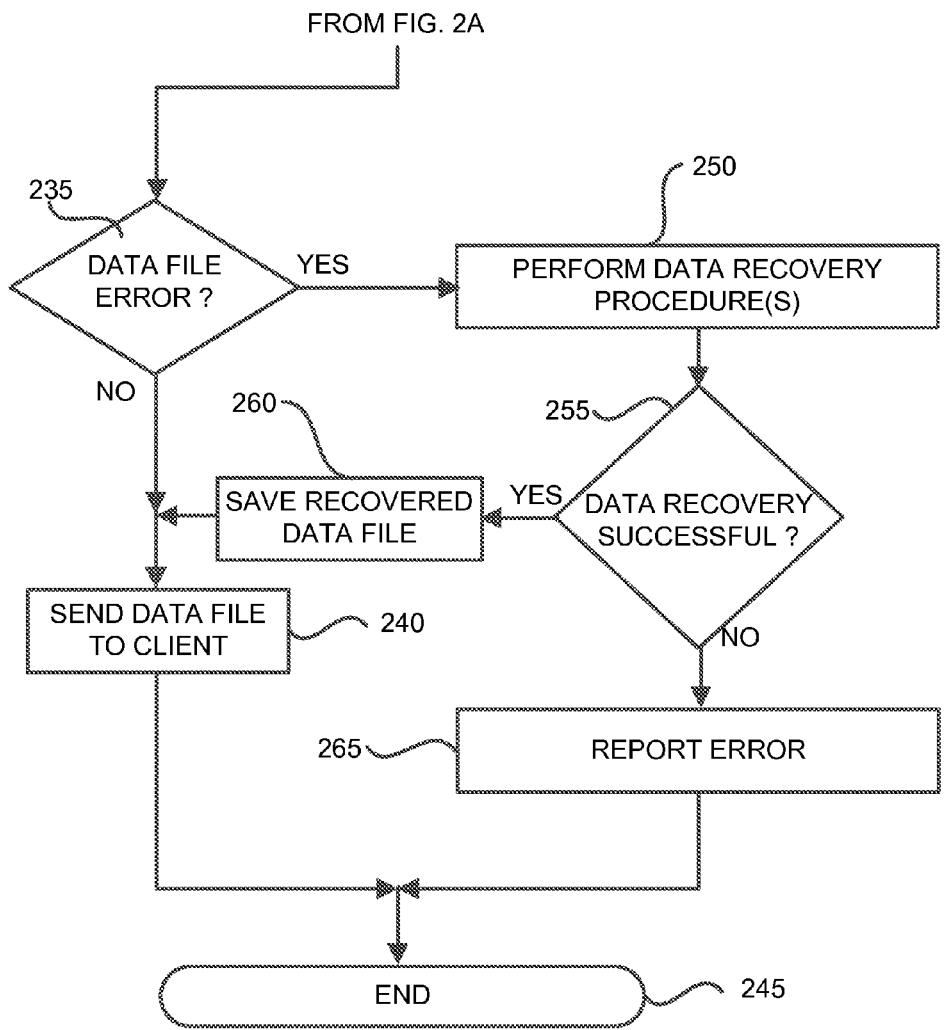
Figure 3A:
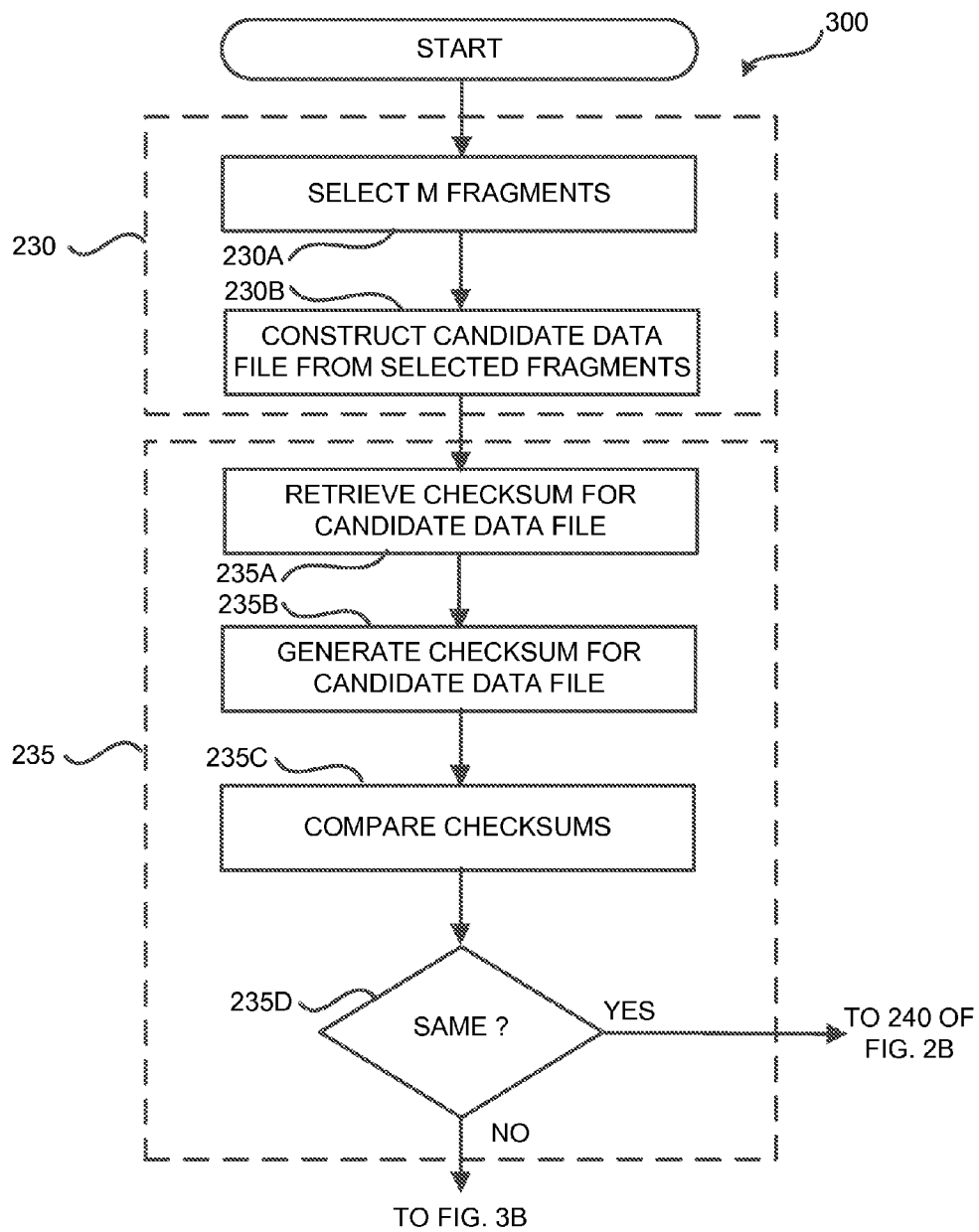
FIGS. 3A-3D are flow diagrams showing one illustrative data file recovery routine performed by a client access server to recover a data file from erasure-coded fragments for that data file.
Figure 3B:
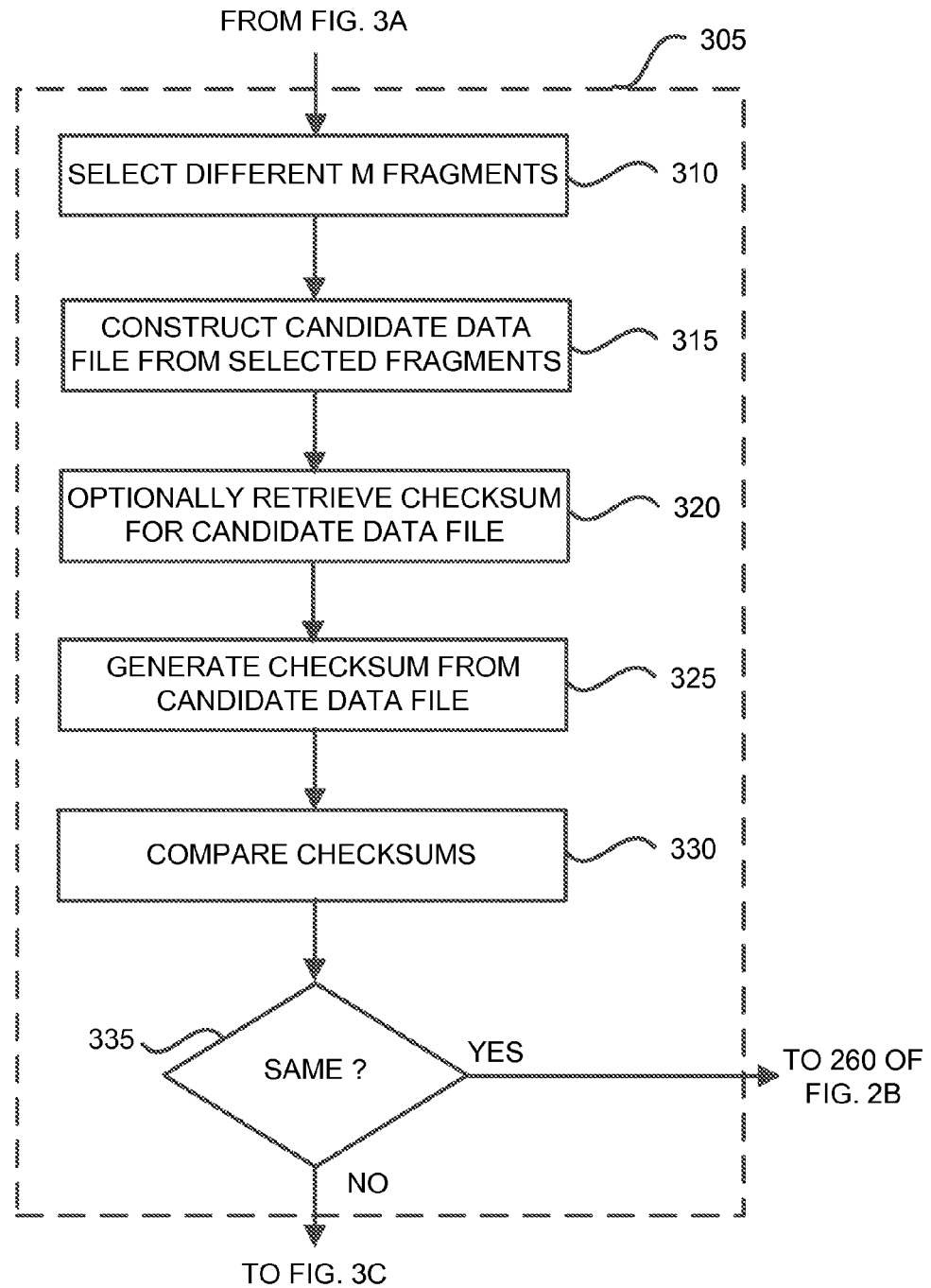
Figure 3C:
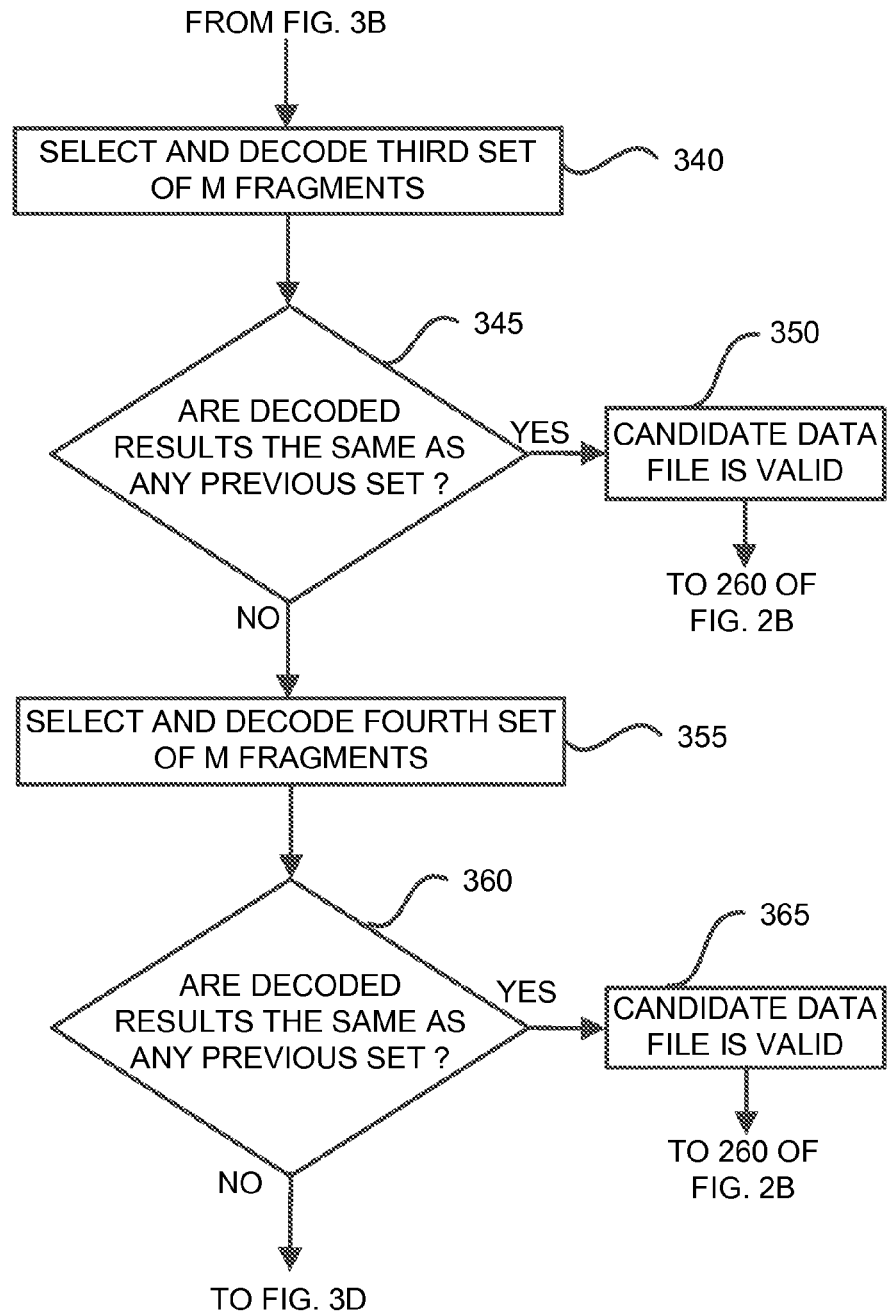
Figure 3D:
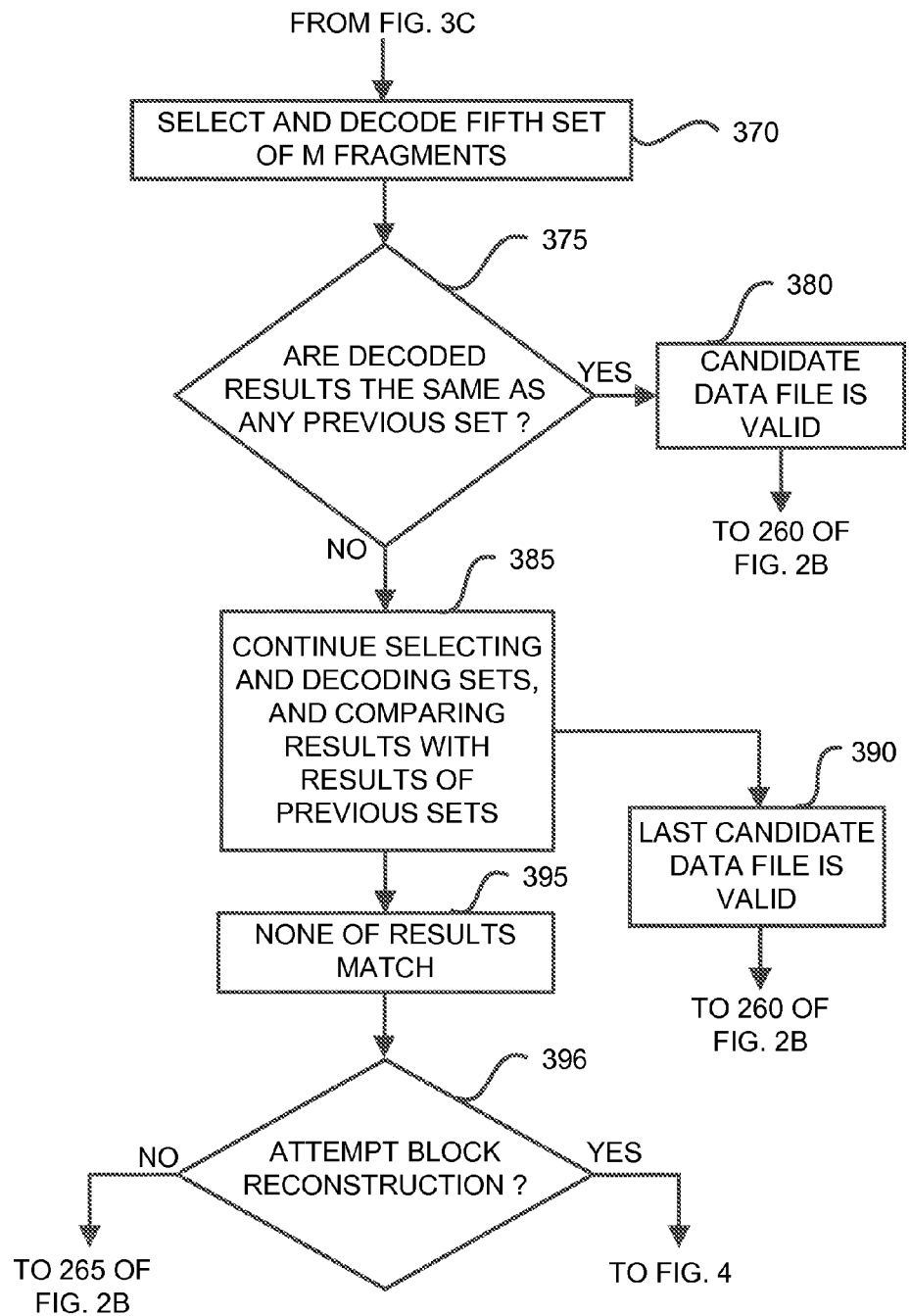

FIGS. 2A-2B are flow diagrams showing an illustrative routine 200 performed by a client access server 20 or other computing device to reconstruct a data file from erasure-coded fragments for that data file. It should be appreciated that the logical operations described herein with respect to FIGS. 2A-2B, and the other figures herein are implemented (1) as a sequence of computer implemented acts or program modules running on a computing system and/or (2) as interconnected machine logic circuits or circuit modules within the computing system. The implementation of the various components described herein is a matter of choice dependent on the performance and other requirements of the computing system. Accordingly, the logical operations described herein are referred to variously as operations, structural devices, acts, or modules. These operations, structural devices, acts, and modules may be implemented in software, in firmware, in special purpose digital logic, and any combination thereof. It should also be appreciated that more or fewer operations may be performed than shown in the figures and described herein. These operations may also be performed in parallel, or in a different order than those described herein.

The routine 200 begins at operation 205, where the client access server 20 receives a data file from a client computer 10 for storage. The routine 200 then proceeds to operation 210, where erasure-coded fragments and checksums for each fragment are generated. If the data file does not already have a checksum, then a checksum is generated and becomes part of the data file. At operation 215, the erasure-coded fragments, including their checksums, are distributed to the various servers 30A-30N for storage. Typically, a server 30 will have some of the fragments of a data file, but not all of the fragments for the data file.

At operation 220, the client access server 20 receives a request for the data file from the client computer 10. The routine 200 then proceeds to operation 225, where the client access server 20 requests at least some of the servers 30A-30N to retrieve and return the previously-distributed erasure-coded fragments with their checksums, and the client access server 20 receives the fragments and checksums from those servers 30A-30N.

Typically, the client access server 20 will generate a checksum for each received fragment and compare that with the retrieved checksum for the received fragment to determine, at a simple level, whether the fragment is good. If the generated and retrieved fragment checksums match, then the fragment is likely, but not necessarily, good. If the generated and retrieved fragment checksums do not match, then corruption has occurred, but it is not yet known whether the corruption is in the fragment or the retrieved checksum for that fragment.

Preferably, fragments for which the generated and retrieved checksums match are selected and used for construction of the candidate data file. However, even if they do not match, it is still possible that the fragment is correct, or that the data file can still be accurately reconstructed. The approach discussed below is useful regardless of whether the generated and retrieved checksums for a fragment match. It can even be used without first comparing the generated and retrieved checksums for a fragment. Preferably, however, fragments that have matching generated and retrieved checksums are initially used to attempt to construct a candidate data file.

At operation 230, the client access server 20 constructs a candidate data file based upon the selected fragments. The routine 200 then process to operation 235, where a determination is made as to whether the candidate data file has an error. For example, the checksum generated for the candidate data file may not match the original (retrieved) checksum for the data file. If there is no error then the client access server 20 sends the candidate data file to the client computer 10 as the requested data file at operation 240. The routine 200 then proceeds to operation 245, where it ends.

There are numerous error-detection algorithms or techniques for determining the possible validity of a reconstructed file by detecting errors in the reconstructed file and, in some cases, for correcting one or errors as well. The checksum is a commonly-used error detection technique and, for convenience of discussion, and not by way of limitation, error detection using checksums will be described herein. Also, the error detection information, such as the checksum, may be included as part of a fragment, such as but not limited to being at the end of the fragment, or may be stored separately from the fragment. If stored separately, the fragment and/or the checksum may have a pointer to each other, or there may be a table with pointers to a fragment and its associated checksum, and a fragment and its associated checksum may be stored on the same storage device or even on different storage devices.

If, at operation 235, an error is detected in the candidate data file, then one or more of the fragments of the file, or even the retrieved checksum, has become corrupted. Consequently, a data recovery procedure is performed at operation 250. Data recovery procedures are discussed below with respect to FIGS. 3 and 4. From operation 250, the routine 200 proceeds to operation 255, where a determination is made as to whether the data correction procedure(s) was successful (i.e. whether or not the candidate data file still has an error). If successful, then the client access server 20 saves the recovered candidate data file at operation 260. The client access server 20 then sends the recovered data file to the client computer 10 as the requested data file at operation 40. The routine 200 then proceeds to operation 245, where it ends.

Saving the recovered data file may include one or more of: (i) generating a new set of erasure-coded fragments based on the candidate data file; (ii) replacing the previously-stored erasure-coded fragments with the new erasure-coded fragments; (iii) comparing the previously-stored erasure-coded fragments with corresponding new erasure-coded fragments, such as on a bit-by-bit basis or a checksum basis, and replacing any different previously-stored erasure-coded fragment with the corresponding new erasure-coded fragment; or (iv) replacing any previously-stored erasure-coded fragments that were not used to construct the candidate data file with corresponding new erasure-coded fragments. The particular choice of which operation (ii), (iii), (iv) may be determined by factors such as, for example, but not limited to, the difficulty of overwriting individual fragments as compared to replacing an entire file.

Saving the recovered data file may also include generating a reconstructed checksum for the recovered data file and the fragments, and storing the reconstructed checksum(s) as the checksum(s) for the data file and/or the fragments. This corrects the problem where the fragments are good, but the original data file checksum has become corrupted. Reconstruction and saving of checksums (or other error-detection information) is preferably, but not necessarily, performed for both the data file level and for the fragments. This may be done with or without first comparing the original checksum with the reconstructed checksum to determine if the original checksum had an error.

If, at operation 255, it is determined that the data recovery procedure was not successful and an error is still detected in the candidate data file, then too many of the fragments may have become corrupted. As a result, the routine 200 proceeds from operation 255 to operation 265, where the client access server 20 reports the error to another program, or to a person or department, for further action. The routine 200 then proceeds to operation 245, where it ends.

FIGS. 3A-3D are flow diagrams showing an illustrative data file recovery routine 300 performed by a client access server 20 or other computing device to recover a data file from the erasure-coded fragments for that data file when one or more fragments have become corrupted. The routine 300 begins at operation 230A, of FIG. 2B, where a first set of m of the n fragments are selected to be used in constructing the candidate data file. The selection may be based on any desired process, such as but not limited to, first m fragments, last m fragments, every other fragment, every third fragment, particular fragments from particular servers 30, etc., as long as m fragments are selected.

For convenience of discussion herein, and not by way of limitation or preference, the selection for the first set is the first m fragments. The candidate data file is then constructed at operation 230B using the selected fragments. The routine 300 then proceeds to operation 235A, where a checksum is retrieved for the constructed candidate data file. At operation 235B, a checksum is generated based upon the candidate data file. At operation 235C, the checksums are compared. At operation 235D, if the checksums are the same then the candidate data file is valid and the fragments used to generate the candidate data file are valid, so no further action is required, and either operation 240 or 260 of FIG. 2B is commenced.

If the checksums are not the same, then at least one of the fragments has become corrupted. Therefore, a next attempt to construct the file is made at operation 305. In particular, at operation 310 a second, different set of m fragments is selected. Preferably, but not necessarily, the fragment sets are completely independent. In some schemes, such as but not limited to a ½n-of-n scheme, such as but not limited to a 3-of-6 scheme, the ½n (3) fragments used in a first attempt to construct a candidate data file can be completely different from the ½n (3) fragments used in a second attempt to construct a candidate file. Thus, the fragment sets are completely independent. In other schemes, however, such as but not limited to a 4-of-7 scheme, at least one fragment will be common to both sets, so complete independence between the fragment sets is not achieved.

At operation 315, a next (second) candidate data file is constructed based upon this next (second) set of fragments. A checksum is then retrieved at operation 320 for the next candidate data file, a checksum is generated at operation 325 based upon this next candidate data file, and then the checksums are compared at operation 330. At operation 335, if the checksums are the same, then the data file has been successfully reconstructed, the fragments used to generate this candidate data file are valid, and operation 260 of FIG. 2B is commenced using the next (second) constructed data file.

The original checksum may be stored in numerous locations, and one or more of the stored original checksums may have become corrupt. Therefore, the process of retrieving and comparing an original checksum should be understood to include retrieving only one version of the stored checksum, retrieving and comparing more than one version of the stored checksum. Also, once a stored checksum has been retrieved, a further process of retrieving that checksum may be obtaining that checksum again from the same or a different server, or may be simply recalling from local memory the previously retrieved checksum. Thus, after process 235A has been performed once, process 320 is optional.

For a ½n-of-n scheme, such as a 3-of-6 scheme, and assuming that there is only one bad fragment, then there is an equal chance that the bad fragment will be in the ½n (3) fragments chosen as in the ½n (3) fragments not chosen, so the probability of getting a valid data file construction is 50% for the first attempt. If there is a second attempt, then it is because the first attempt failed, so the bad fragment is in the first set of fragments. Therefore, as the assumption was that there was only one bad fragment, and it is in the first set, there cannot also be a bad fragment in this second set of fragments, so all the fragments in the second set must be good. Therefore, the probability of getting a valid data file construction is 100% for the second attempt. Note that the data file has been recovered in just two attempts by using independent fragment sets.

At operation 335, if the checksums are not the same, then at least one, and possibly two or more, of the selected fragments is corrupted, or the original, retrieved checksum may be corrupted. Depending upon the erasure-coding scheme used, and the manner in which the fragments are selected, some information may be available as to how many fragments are corrupted and which fragment(s) are corrupted. One example is where n is an odd number, and m is an integer just greater than n/2, such as in a 4-of-7 scheme. If it assumed that only one fragment is corrupted, and both attempts yielded invalid results, then the corrupt fragment must be the common fragment used in both attempts. Therefore, a next attempt might use one of the previous sets but would use a fragment different than the common fragment. If only the common fragment was corrupt then the reconstructed data file should now be valid and operation 260 would be performed. Note also that the data file would be recovered in just three attempts.

Another example is where 2 m is greater than n, such as in an 8-of-14 erasure-coding scheme. If the attempts fail, i.e., the checksums are not the same, then it is likely that one or more of the overlapping (common) fragments is corrupted. Therefore, a next attempt would use one of the previous fragment selections but would replace the common fragments in the selection with different fragments. If only the common fragment(s) is (are) corrupt then the reconstructed data file should be valid and operation 260 would be performed. Note again that the data file might be recovered in just three attempts.

Still another example is where m is an integer less than n/2, such as in a 3-of-7 or 4-of-10 erasure-coding scheme. If the attempts fail, i.e., the checksums are not the same, then it is likely that at least two fragments are bad, i.e., at least one in each selection. Therefore, a next selection attempt would start with fragments which have not been previously used for either selection and complete the selection with previously-used fragments from one or both of the previous fragment sets. If the reconstructed data file is valid then operation 260 would be performed. Note again that the data file might be recovered in just three attempts.

If the initial selection does not result in a valid candidate data file then other combinations of fragments can be tried. One approach, of course, is the "brute force" approach of trying all possible combinations until a valid candidate data file is obtained. For example, in a 3-of-7 scheme, the brute force approach might select [1, 2, 3], [1, 2, 4], [1, 2, 5], [1, 2, 6], [1, 2, 7], [1, 3, 4], . . . [1, 6, 7], etc. As mentioned above, however, this becomes impractical where n is large. Also, if the corrupt fragment is fragment #1, for example, then the brute force approach might waste a large amount of time and computing power as the first fifteen attempts (above) would be unsuccessful. Thus, the first fragment selection that might result in a valid candidate data file selected using the brute force approach is the next set in the sequence: [2, 3, 4]. Instead, at operation 340, a third set of fragments is selected y, and then decoded.

The fragment sets may be selected using a brute force approach or a random selection approach. Preferably, however, the method of selecting fragments is optimized to find a valid fragment set quickly and efficiently. Such an optimal selection order may, for example, start with selecting independent sets of fragments if possible, that is, sets which do not share any fragments. If a valid candidate data file did not result, then the next step would be selecting sets which share only one common fragment with any previous set. Then only two common fragments, etc. Eventually, if necessary, sets would be used which different from a previous set or sets by only one fragment.

An example of an optimal set selection order for an exemplary 3-of-7 erasure-coding scheme is as shown below in Table I. Other optimal set may also be possible.

TABLE I

| SET NUMBER | FRAGMENTS |
|---|---|
| 1 | [2, 1, 0] |
| 2 | [5, 4, 3] |
| 3 | [6, 3, 0] |
| 4 | [6, 4, 1] |
| 5 | [6, 5, 2] |
| 6 | [5, 1, 0] |
| 7 | [4, 3, 2] |
| 8 | [4, 2, 0] |
| 9 | [5, 3, 1] |
| 10 | [6, 4, 0] |
| 11 | [3, 2, 1] |
| 12 | [6, 5, 0] |
| 13 | [6, 2, 1] |
| 14 | [5, 4, 1] |
| 15 | [3, 2, 0] |
| 16 | [6, 4, 3] |
| 17 | [5, 4, 2] |
| 18 | [3, 1, 0] |
| 19 | [6, 5, 3] |
| 20 | [4, 1, 0] |
| 21 | [5, 2, 0] |
| 22 | [6, 3, 1] |
| 23 | [6, 4, 2] |
| 24 | [5, 3, 0] |
| 25 | [5, 2, 1] |
| 26 | [6, 5, 4] |
| 27 | [6, 1, 0] |
| 28 | [4, 3, 0] |
| 29 | [6, 3, 2] |
| 30 | [4, 2, 1] |
| 31 | [5, 4, 0] |
| 32 | [6, 5, 1] |
| 33 | [5, 3, 2] |
| 34 | [6, 2, 0] |
| 35 | [4, 3, 1] |

It will be seen from TABLE I that the first two selections are independent, the next selections share only one segment in common with any previous set, etc.

Operation 345 tests whether the results from the third set match the results of any previous set. If there is a match, then it is presumed at operation 350 that the candidate data file is valid and that the two sets of fragments used to generate this candidate data file are valid, the two sets of fragments being the set currently selected and the set used to generate the matching candidate data file. Operation 260 of FIG. 2B would then be commenced and wherein, if desired, new fragments may be encoded and saved.

If the decoded results from the third set of fragments does not have a match, then a fourth set of fragments is selected and decoded at operation 355. Operation 360 tests whether the results from the fourth set match the results of any previous set. If there is a match, then it is presumed at operation 365 that the candidate data file is valid and that the two sets of fragments used to generate this candidate data file are valid. Operation 260 of FIG. 2B would then be commenced and wherein, if desired, new fragments may be encoded and saved.

If the decoded results from the fourth set of fragments does not have a match, then a fifth set of fragments is selected and decoded at operation 370. Operation 375 tests whether the results from the fifth set match the results of any previous set. If there is a match then it is presumed at operation 380 that the candidate data file is valid and that the two sets of fragments used to generate this candidate data file are valid. Operation 260 of FIG. 2B would then be commenced and wherein, if desired, new fragments may be encoded and saved.

If the decoded results from the fifth set of fragments does not have a match, then operation 385 continues selecting sets of fragments, decoding the results, and comparing the results with results of previously selected and decoded sets. This may be repeated until a predetermined criteria is met, such as, by way of example and not of limitation, that a candidate data file matches a previous candidate data file, that all possible sets of fragments have been unsuccessfully used to produce candidate data files, or that a predetermined number of candidate data files have been generated and no two of them are matching. If there is a match it is presumed at operation 390 that this last candidate data file is valid and that the two sets of fragments used to generate this candidate data file are valid. Operation 260 of FIG. 2B would then be commenced and wherein, if desired, new fragments may be encoded and saved.

If all, or some predetermined maximum number, of the possible sets have been tried and there has not been any match at operation 395, then it is likely that two or more of the fragments have been corrupted. Operation 396 determines whether an attempt should be made to reconstruct the fragments on a block-by-block basis. This may be based on a pre-set configuration selection, the size of the files, the erasure-coding scheme used, or other criteria. If not, then operation 265 of FIG. 2B is commenced. If so, then the routine 400 described below with regard to FIG. 4 is commenced.

Although, for efficiency, it is preferred that operation 305 be performed, another approach is possible. After the first set of m fragments has been tried, and has failed, one could then begin selecting sets of fragments, generating data files, and comparing the generated data files for a match, as in operations 340-385, thereby effectively skipping operation 305.

Figure 4A:
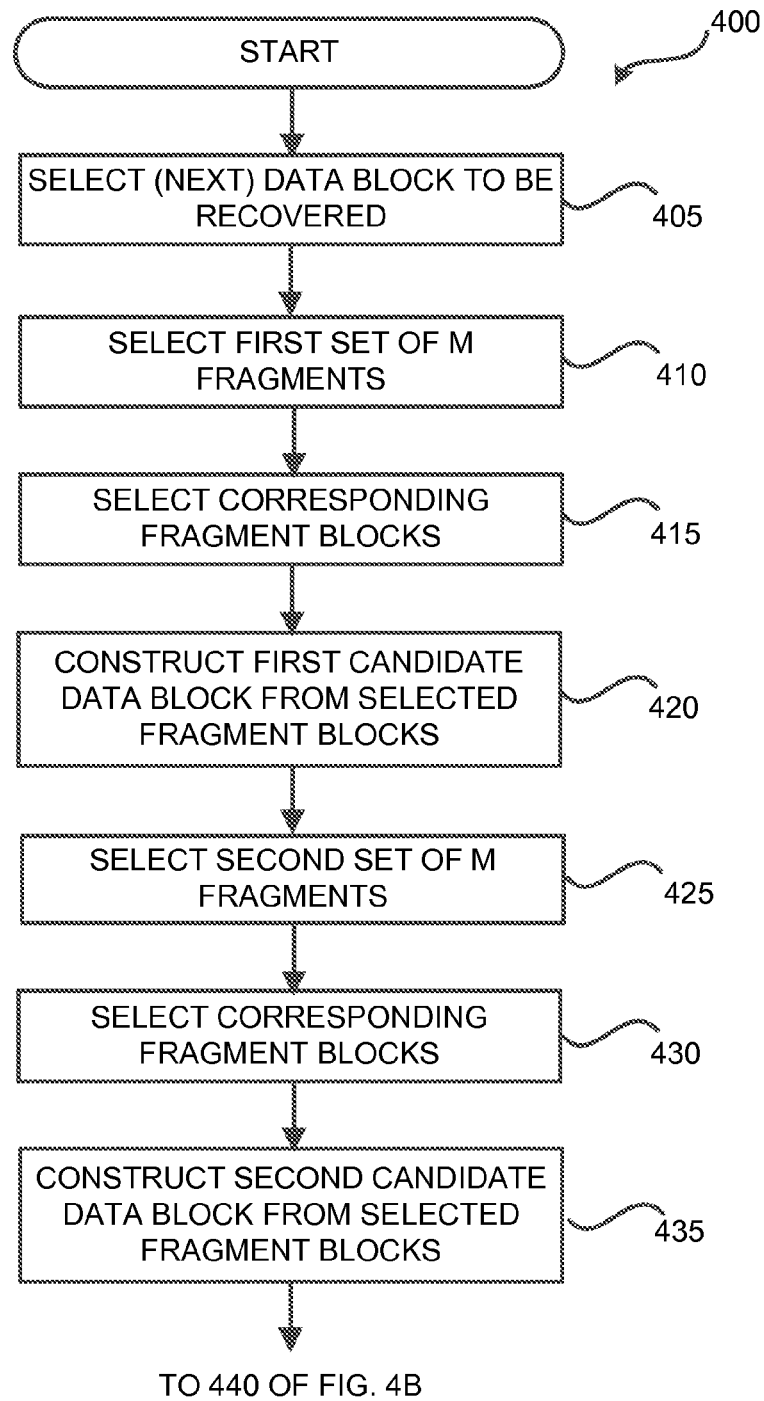
FIGS. 4A-4C are flow diagrams showing an illustrative routine performed by a client access server to recover a block of data in a data file using erasure-coded fragments for that data file.
Figure 4B:
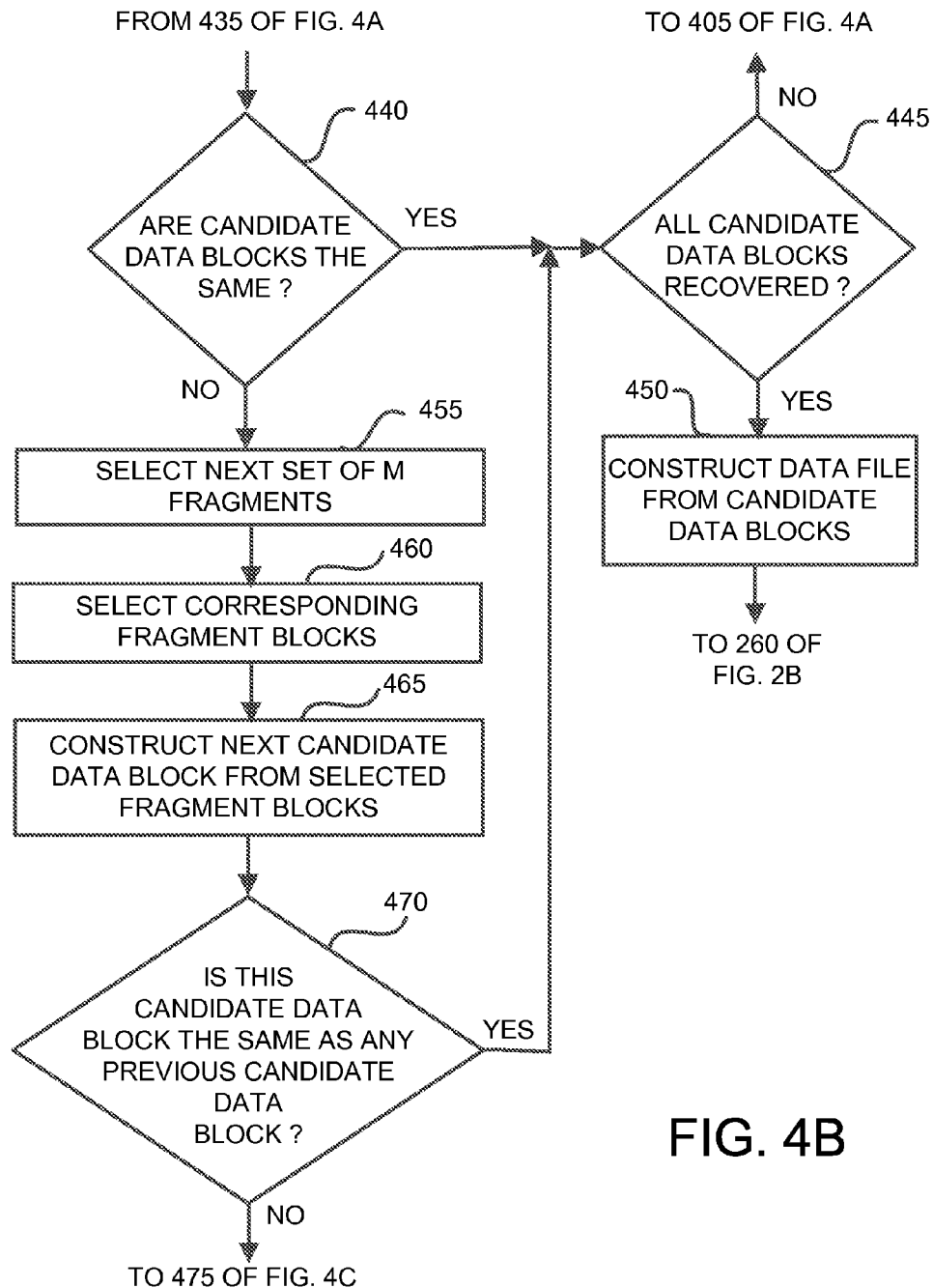
Figure 4C:
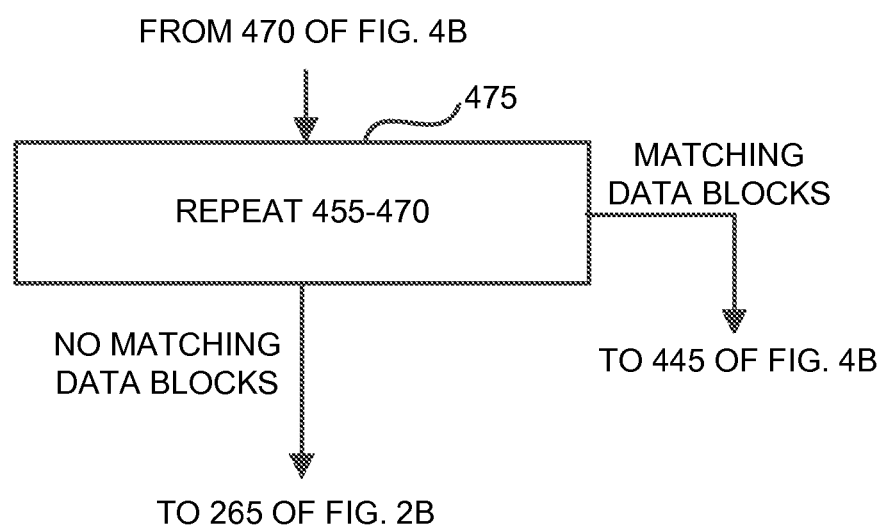

FIGS. 4A-4C are flow diagrams showing an illustrative routine 400 performed by a client access server 20 to recover a block of data in a data file using erasure-coded fragments for that data file. If, at operation 395 of FIG. 3, no matching candidate data files have been found, then multiple fragments are corrupted, and there are not enough good fragments to create a valid candidate data file. It will be recalled, from knowledge of erasure-coding, that the original data file is broken into blocks, and fragments are composed of blocks, and there is a relationship between these different blocks. If one block in a fragment is corrupt, then the fragment is corrupt, and cannot be used to directly reconstruct the original data file. It is possible that there may not be enough good fragments to directly create a valid candidate data file. The valid fragment blocks, however, if there are enough, can be used to reconstruct an original data block.

In a 3-of-6 scheme, for example, blocks from three fragments can be used to reconstruct an original block of data, even if all three fragments are corrupt, as long as the fragment blocks corresponding to that data block are not corrupt. For example, assume that fragments 1 and 2 are good, and that fragments 3-6 are corrupted. Also assume that the original data file represents three blocks of data and that block 1 is valid in fragments 1, 2 and 6, but corrupt in fragments 3, 4 and 5. Similarly, assume that block 2 is valid in fragments 1, 2, 3, and 5, but corrupt in fragments 4 and 6, and that block 3 is valid in fragments 1, 2, and 4, but corrupt in fragments 3, 5, and 6. Now, only two valid fragments (1, 2) are available so the data file cannot be directly reconstructed from the available fragments. For each block of data, however, there are enough fragments having valid portions to reconstruct each block. If there are enough valid fragment blocks, then each data block can be individually reconstructed, and the reconstructed data blocks can then be combined to form the original data object.

A problem is that one does generally not know where the error(s) lies in a fragment. Thus, if fragments 3-6 are corrupt, one does not know whether the error is in block 1 of the fragment, block 2 of the fragment, block 3 of the fragment, etc. Although the original data object has a checksum, and each fragment has a checksum, neither the blocks within the original data object nor the blocks within the fragments have checksums. Thus, the simple checksum error-detection technique is not useful at this level because there is no original checksum available for comparison. Thus, if a data block is reconstructed, the question remains whether it is valid as it may be based on corrupted fragment blocks.

Comparing a block of data from one fragment with a block of data from another fragment does not provide any useful information about the quality of the fragment blocks; the fragment blocks are based on the same data block, but the erasure-coding scheme ensures that the fragment blocks are different. Also, as mentioned, there is no checksum at this level, so the fidelity of the reconstructed block cannot be determined by a checksum. To determine the validity of a data block reconstructed from fragment blocks, a reconstructed block of data based on the fragment blocks of one set of fragments is compared with a reconstructed block of data based on the fragment blocks of another set of fragments. If they are the same then the reconstruction is likely to be valid based on the premise that an error in a block in one fragment is unlikely to be identical to, and produce the same result as, an error in a block in another fragment. To achieve a level confidence of the fidelity of the reconstructed block, several combinations of different fragments are used. This procedure can be repeated for each of the original data blocks so that the complete original data file can be assembled therefrom.

Upon starting the routine 400, the data block to be recovered, or the next data block to be recovered, is selected at operation 405. The selection may be straightforward, for example, data block 0, then data block 1, then data block 2, etc., or may be based on any desired selection technique. At operation 410, a first set of m fragments is selected. This selection may be straightforward, for example, fragments 1, 2, and 3, or may be based on any desired selection technique as long as no two sets contain the same fragments. At operation 415, the corresponding fragment blocks are selected (extracted) from the first set of selected fragments. For example, if data block 1 has been selected to be recovered, then block 1 of fragments 1, 2, and 3 will be selected. At operation 420, the first candidate data block is constructed using the selected blocks from the selected fragments as the inputs to the algorithm that is used to construct candidate data files from fragments.

At operation 425, a second set of m fragments is selected. At operation 430, the corresponding blocks are selected (extracted) from the second set of selected fragments. At operation 435, the second candidate data block is constructed using the selected blocks from the selected fragments as the inputs to the algorithm that is used to construct candidate data files from fragments. Operation 440 then tests whether the candidate data blocks are the same. This can be done by any convenient and useful technique, for example, using a bit-by-bit comparison or by generating and comparing checksums of the candidate data blocks.

If the candidate data blocks are the same, then at determination is made at operation 440 as to whether all of the candidate blocks for a data file have been recovered. If so, then operation 450 constructs the data file from the candidate data blocks and then proceeds to operation 260 of FIG. 2B. If not, then the routine 400 proceeds back to operation 405 to attempt to recover the next data block. If, at operation 440, the candidate data blocks are not the same then a next set of m fragments is selected at operation 455, the corresponding fragment blocks are selected (extracted) at operation 460, and the next candidate data block is constructed at operation 465 using the selected blocks from the selected fragments.

At operation 470 a determination is made as to whether this candidate data block is the same as any previous candidate data block. If there is a match, then operation 445 is performed. If there is not a match, then operation 475 is performed. At operation 475, operations 455-470 are repeated until a predetermined criteria is met, such as, by way of example and not of limitation, that matching data blocks are found, all the possible fragment combinations have been attempted, or a predetermined number of candidate data blocks have been generated and no two of the generated candidate data blocks are matching. If matching data blocks are found then operation 445 is commenced. If no matching data blocks have been found, then operation 265 of FIG. 2B is commenced.

Figure 5:
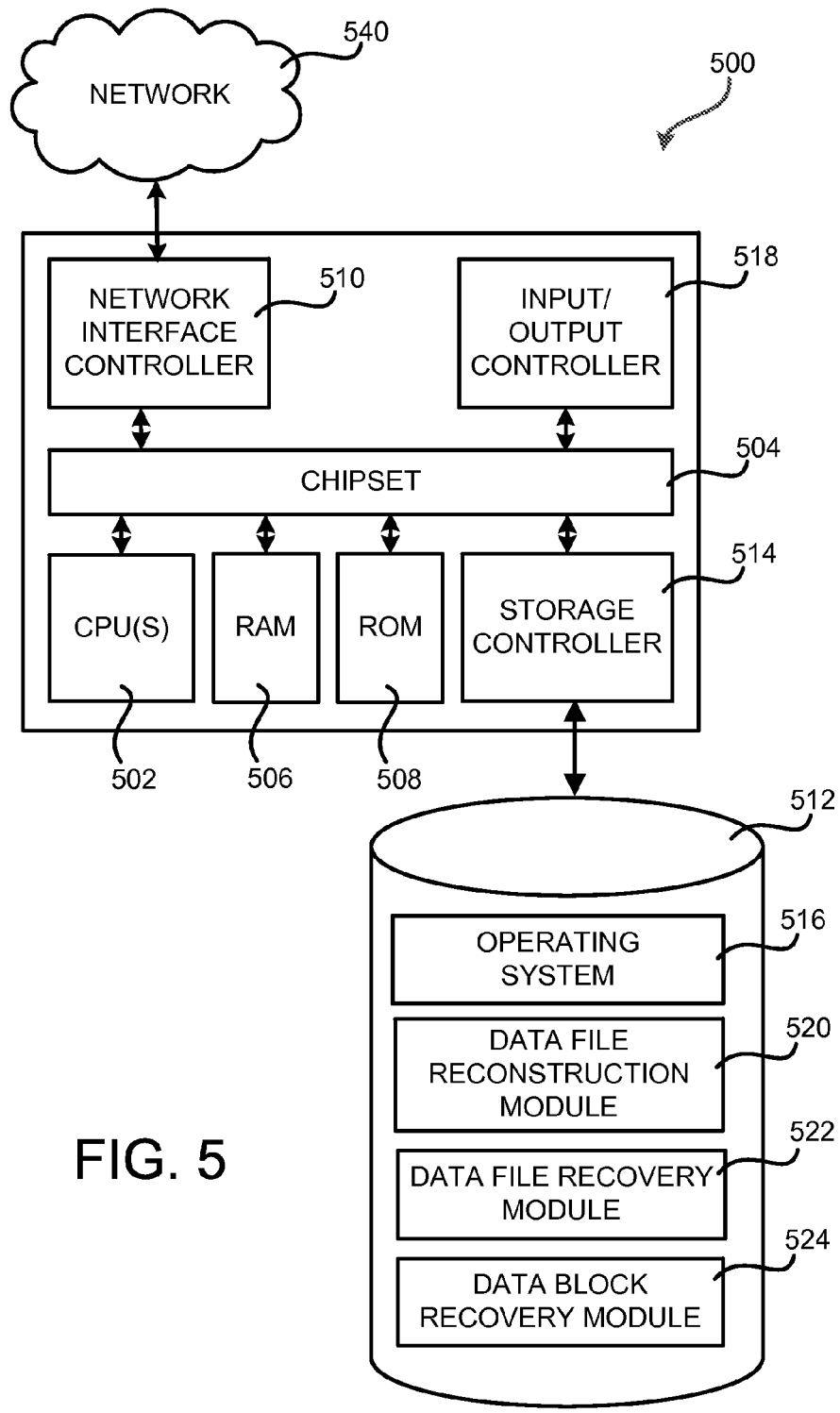
FIG. 5 is a computer architecture diagram showing an exemplary computer architecture for a client access server or other computing device capable of performing the functionality disclosed herein for storage and recovery of erasure-coded files.

FIG. 5 is a computer architecture diagram showing an exemplary computer architecture for a client access server or other computing device capable of performing the functionality disclosed herein for storage and recovering erasure-coded files. The computer architecture shown illustrates a conventional server computer, workstation, desktop computer, laptop, network appliance, or other computing device, and may be utilized to execute any aspects of the software components presented herein described as executing within the computing device and/or other computing devices mentioned herein.

The computer 500 includes a baseboard, or "motherboard," which is a printed circuit board to which a multitude of components or devices may be connected by way of a system bus or other electrical communication paths. In one illustrative embodiment, one or more central processing units ("CPUs") 502 operate in conjunction with a chipset 504. The CPUs 502 are standard programmable processors that perform arithmetic and logical operations necessary for the operation of the computer 500.

The CPUs 502 perform the necessary operations by transitioning from one discrete, physical state to the next through the manipulation of switching elements that differentiate between and change these states. Switching elements may generally include electronic circuits that maintain one of two binary states, such as flip-flops and electronic circuits that provide an output state based on the logical combination of the states of one or more other switching elements, such as logic gates. These basic switching elements may be combined to create more complex logic circuits, including registers, adders-subtractors, arithmetic logic units, floating-point units and the like.

The chipset 504 provides an interface between the CPUs 502 and the remainder of the components and devices on the baseboard. The chipset 504 may provide an interface to a random access memory ("RAM") 506, used as the main memory in the computer 500. The chipset 504 may further provide an interface to a computer-readable storage medium such as a read-only memory ("ROM") 508 or non-volatile RAM ("NVRAM") for storing basic routines that that help to startup the computer 500 and to transfer information between the various components and devices. The ROM 508 or NVRAM may also store other software components necessary for the operation of the computer 500 in accordance with the embodiments described herein.

The computer 500 may operate in a networked environment using logical connections to remote computing devices and computer systems through the network 540. The chipset 504 may include functionality for providing network connectivity through a network interface controller ("NIC") 510, such as a gigabit Ethernet adapter. The NIC 510 is capable of connecting the computer 500 to other computing devices over the network 540. It should be appreciated that multiple NICs 510 may be present in the computer 500, connecting the computer to multiple communication channels, such as but not limited to communication channels 17, 75, 76, 80, 85, in the network 540, other types of networks, and remote computer systems.

The computer 500 may be connected to a mass storage device 512 that provides non-volatile storage for the computer. The mass storage device 512 may store system programs, application programs, other program modules and data, which have been described in greater detail herein. The mass storage device 512 may be connected to the computer 500 through a storage controller 514 connected to the chipset 504. The mass storage device 512 may consist of one or more physical storage units. The storage controller 514 may interface with the physical storage units through a serial attached SCSI ("SAS") interface, a serial advanced technology attachment ("SATA") interface, a fiber channel ("FC") interface, or other type of interface for physically connecting and transferring data between computers and physical storage units.

The computer 500 may store data on the mass storage device 512 by transforming the physical state of the physical storage units to reflect the information being stored. The specific transformation of physical state may depend on various factors, in different implementations of this description. Examples of such factors may include, but are not limited to, the technology used to implement the physical storage units, whether the mass storage device 512 is characterized as primary or secondary storage and the like.

For example, the computer 500 may store information to the mass storage device 512 by issuing instructions through the storage controller 514 to alter the magnetic characteristics of a particular location within a magnetic disk drive unit, the reflective or refractive characteristics of a particular location in an optical storage unit, or the electrical characteristics of a particular capacitor, transistor, or other discrete component in a solid-state storage unit. Other transformations of physical media are possible without departing from the scope and spirit of the present description, with the foregoing examples provided only to facilitate this description. The computer 500 may further read information from the mass storage device 512 by detecting the physical states or characteristics of one or more particular locations within the physical storage units.

In addition to the mass storage device 512 described above, the computer 500 may have access to other computer-readable storage medium to store and retrieve information, such as program modules, data structures, or other data. It should be appreciated by those skilled in the art that computer-readable storage media can be any available media that provides for the storage of non-transitory data and that may be accessed by the computer 500.

By way of example, and not limitation, computer-readable storage media may include volatile and non-volatile, removable and non-removable media implemented in any method or technology. Computer-readable storage media includes, but is not limited to, RAM, ROM, erasable programmable ROM ("EPROM"), electrically-erasable programmable ROM ("EEPROM"), flash memory or other solid-state memory technology, compact disc ROM ("CD-ROM"), digital versatile disk ("DVD"), high definition DVD ("HD-DVD"), BLU-RAY, or other optical storage, magnetic cassettes, magnetic tape, magnetic disk storage or other magnetic storage devices, or any other medium that can be used to store the desired information in a non-transitory fashion.

The mass storage device 512 may store an operating system 516 utilized to control the operation of the computer 500. According to one embodiment, the operating system includes a member of the LINUX family of operating systems. According to another embodiment, the operating system includes a member of the WINDOWS® SERVER family of operating systems from MICROSOFT Corporation in Redmond, Wash. According to further embodiments, the operating system may include a member of the UNIX or SOLARIS families of operating systems. It should be appreciated that other operating systems may also be utilized. The mass storage device 512 may store other system or application programs, modules, and/or data utilized by the computer 500 such as: a data file reconstruction module 520 that performs an algorithm for reconstructing a data file from the selected fragments; a data file recovery module 522 for attempting recovery of a data file when one or more fragments have been corrupted; and/or a data block recovery module 524 to attempt recovery of data block and to reconstruct a data file based thereon.

In one embodiment, the mass storage device 512 or other computer-readable storage media is encoded with computer-executable instructions that, when loaded into the computer 500, transform the computer from a general-purpose computing system into a special-purpose computer capable of implementing the embodiments described herein. These computer-executable instructions transform the computer 500 by specifying how the CPUs 502 transition between states, as described above. According to one embodiment, the computer 500 has access to computer-readable storage media storing computer-executable instructions which, when executed by the computer 500, perform aspects of one or more of the methods or procedures described herein.

The computer 500 may also include an input/output controller 518 for receiving and processing input from a number of input devices, such as a keyboard, a mouse, a touchpad, a touch screen, an electronic stylus, or other type of input device. Similarly, the input/output controller 518 may provide output to a display, such as a computer monitor, a flat-panel display, a digital projector, a printer, a plotter, or other type of output device. It will be appreciated that the computer 500 may not include all of the components shown herein, may include other components that are not explicitly shown herein, or may utilize an architecture completely different than that shown herein.

Although the exemplary computer architecture shown and discussed herein is directed to the client access server 20, this general architecture is also suited for the storage servers 30 and the client computer 10, the primary difference being the use of different modules or programs in the mass storage device 512 so as to provide for implementation of the different functions performed by the particular device.

Figure 6:
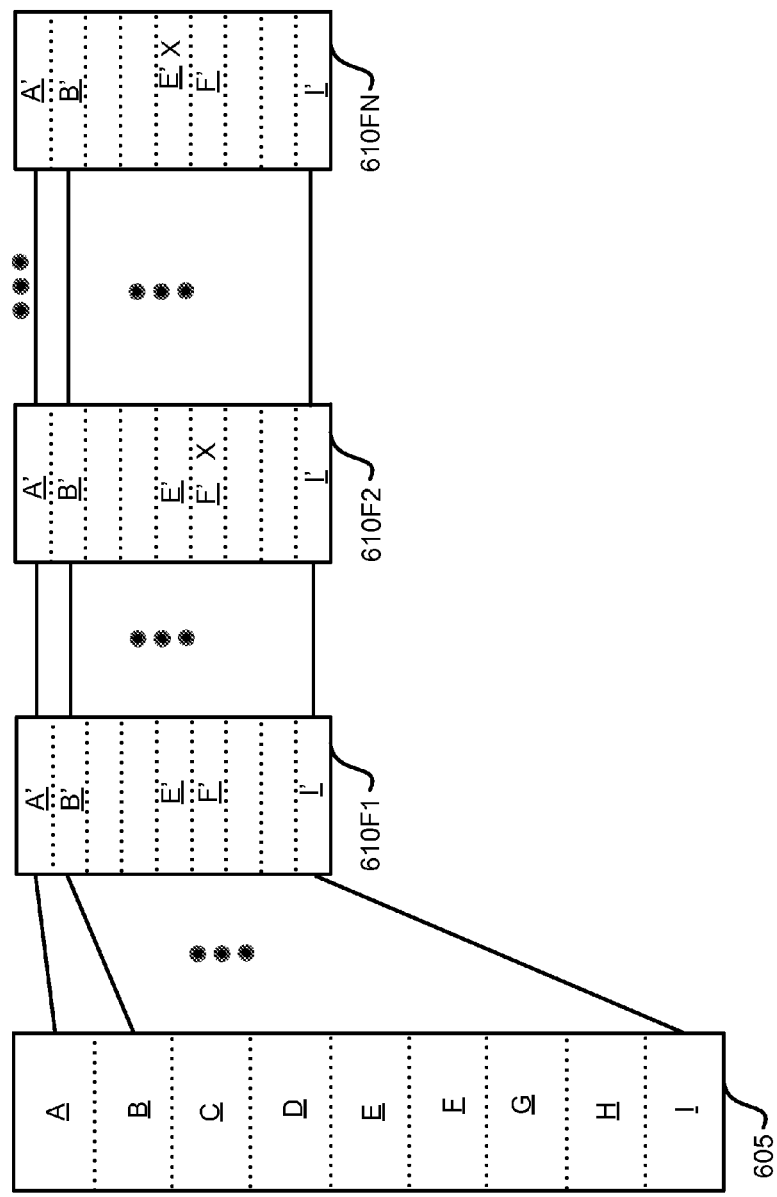
FIG. 6 is an illustration of a data file, data fragments, and blocks therein.

FIG. 6 is an illustration of a data file 605, data fragments 610F1-610FN, and blocks A-I therein. As mentioned, for m-of-n erasure coding, a data file 605 is broken into a plurality of data blocks A-I. Each data block A-I is erasure coded to produce a corresponding fragment data block A'-I' for each of the fragments 610F1-610FN. Any m of the fragments, if not corrupted, can be used to reconstruct the data file 605. Also, as discussed herein, any m of the fragment blocks A'-I' can be used to reconstruct a corresponding data block A-I. Assume that fragment block 610F2F' and fragment block in fragment 610FNE' have been corrupted, as indicated by an X in those blocks. Therefore, these two fragments cannot be directly used to reconstruct the original data file 605. As long as there are m other good fragments, however, the original data file 605 can be reconstructed. If there are not enough good fragments, then m fragment blocks can be used to reconstruct a data block. The various data blocks can be reconstructed using fragment blocks from different fragments. For example, data block 605A can be reconstructed using fragment blocks 610F1A, 610F2A, 610F3A, etc.; whereas data block 605F can be reconstructed using fragment blocks 610F1F, 610F3F, 610FNF, etc. Note that fragment block 610F2F is corrupted and would not result in same data block as 610F1F, 610F3F, 610FNF, etc. However, this cannot be determined by looking at the fragment block itself, but can be identified by comparing the data blocks generated by various combinations of fragment blocks. If matching data blocks are obtained then it is presumed that they are valid reconstructions of the original data block as it is highly unlikely that a data block created from valid fragment blocks would be the same as a data block created from one or more corrupt fragment blocks. The checksum for the data file 605 would be included as, for example, part of data block 605I, or associated with that data block, such as by a pointer or a table. Each fragment 610 also has its own checksum, which would be included, as for example, part of fragment block 610FxI', or associated with that fragment, such as by a pointer or a table. The number of data blocks shown and discussed is for convenience of illustration and is not meant to suggest that only this number of data blocks can or should be used.

Based on the foregoing, it should be appreciated that technologies for efficiently reconstructing data files from erasure-coded fragments, for recovery of data files when one or more erasure-coded fragment is corrupted, and for recovery of data blocks to rebuild a data file when there is insufficient number of good fragments to directly recovery the data file, have been presented herein. Although the subject matter presented herein has been described in language specific to computer structural features, methodological acts, transformative acts, specific computing machinery, and computer readable media, it is to be understood that the appended claims are not necessarily limited to the specific features, acts, or media described herein. Rather, the specific features, acts and mediums are disclosed as exemplary forms of implementing the claims.

The subject matter described above is provided by way of illustration only and should not be construed as limiting. Furthermore, the claimed subject matter is not limited to implementations that solve any or all disadvantages noted in any part of this disclosure. Various modifications and changes may be made to the subject matter described herein without following the exemplary embodiments and applications illustrated and described, and without departing from the true spirit and scope of the present invention, which is set forth in the following claims.

What is claimed is:

1. A computer-implemented method for recovering a data block of a data file from a plurality of original erasure-coded fragments created using an m-of-n erasure coding scheme, the plurality of original erasure-coded fragments comprising fragment blocks corresponding to data blocks in the data file, at least some of which original erasure-coded fragments were stored and may have become corrupted, the method comprising:

selecting a data block of a plurality of data blocks to be recovered;

selecting a first set of m fragments from the stored fragments;

selecting a fragment block from each fragment of the first set of m fragments, the fragment block corresponding to the selected data block;

constructing a first candidate data block based on the selected fragment blocks of the first set of m fragments;

selecting a second set of m fragments from the stored fragments, the second set of m fragments comprising at least one fragment not previously selected;

selecting a fragment block from each fragment of the second set of m fragments, the fragment block corresponding to the selected data block;

constructing a second candidate data block based on the selected fragment blocks of the second set of m fragments;

comparing the second candidate data block to the first candidate data block;

if the second candidate data block matches the first candidate data block, then saving at least one of the second candidate data block or the first candidate data block as a recovered first data block; and if the second candidate data block does not match the first candidate data block then:

selecting a third set of m fragments from the stored fragments, the third set being different from each previous set by at least one fragment, selecting a fragment block from each fragment of the third set of fragments, the fragment block corresponding to the selected data block, constructing a third candidate data block based on the selected fragment blocks of the third set of fragments, comparing the third candidate data block to the first and second candidate data block, and if the third candidate data block matches either the first candidate data block or the second candidate data block then saving at least one of the third candidate data block or the matching first or second candidate data block as a recovered first data block.

2. The computer-implemented method of claim 1 wherein if the third candidate data block does not match either the first candidate data block or the second candidate data block, then further comprising:

(a) selecting a next set of m fragments from the stored fragments, the next set being different from each previous set by at least one fragment;

(b) selecting a fragment block from each fragment of the next set of m fragments, the fragment block corresponding to the selected data block;

(c) constructing a next candidate data block based on the selected fragment blocks of the next set of m fragments;

(d) comparing the next candidate data block to at least one of the candidate data blocks which was previously constructed; and (e) if the next candidate data block matches any candidate data block which was previously constructed then saving at least one of the next candidate data block or the matching candidate data block which was previously constructed, as a recovered first data block.

3. The computer-implemented method of claim 2 wherein if the next candidate data block does not match any candidate data block which was previously constructed, then repeating operations (a)-(e) until a predetermined criteria is met.

4. The computer-implemented method of claim 3 wherein the predetermined criteria is at least one of: the next candidate data block matches one of the candidate data blocks which was previously constructed, all possible sets of m fragments have been used to produce candidate data blocks, or a predetermined number of candidate data blocks have been generated and no two of the generated candidate data blocks are matching.

5. The computer-implemented method of claim 1 wherein, if any candidate data block has been saved as the recovered first data block, then further comprising:

selecting a second data block of the plurality of data blocks to be recovered;

selecting a first set of m fragments from the stored fragments;

selecting a fragment block from each fragment of the first set of m fragments, the fragment block corresponding to the selected second data block;

constructing a first candidate data block based on the selected fragment blocks of the first set of m fragments;

selecting a second set of m fragments from the stored fragments, the second set of m fragments comprising at least one fragment not previously selected;

selecting a fragment block from each fragment of the second set of m fragments, the fragment block corresponding to the selected second data block;

constructing a second candidate data block based on the selected fragment blocks of the second set of m fragments;

comparing the second candidate data block to the first candidate data block; and if the second candidate data block matches the first candidate data block, then saving at least one of the second candidate data block or the first candidate data block as a recovered second data block.

6. The computer-implemented method of claim 1 wherein if the second candidate data block does not match the first candidate data block then:

selecting a third set of m fragments from the stored fragments, the third set being different from each previous set by at least one fragment;

selecting a fragment block from each fragment of the third set of fragments, the fragment block corresponding to the selected data block;

constructing a third candidate data block based on the selected fragment blocks of the third set of fragments;

comparing the third candidate data block to the first and second candidate data block; and if the third candidate data block matches either the first candidate data block or the second candidate data block, then saving at least one of the third candidate data block or the matching first or second candidate data block as a recovered second data block.

7. The computer-implemented method of claim 1 wherein if all of the data blocks of the data file have been recovered, then further comprising constructing the data file from the recovered data blocks.

8. The computer-implemented method of claim 2, further comprising:
generating a new set of erasure-coded fragments based on the constructed data file; and
one of: (i) replacing at least some of the stored fragments with erasure-coded fragments from the new set; (ii) comparing at least some of the stored fragments with corresponding new erasure-coded fragments and replacing any different stored fragment with the corresponding erasure-coded fragment from the new set; or (iii) replacing any stored fragments which are not in one of the selected sets with corresponding new erasure-coded fragments.

9. A non-transitory computer-readable storage medium having computer-executable instructions stored thereupon for recovering a data block of a data file from a plurality of original erasure-coded fragments created using an m-of-n erasure coding scheme, the plurality of erasure-coded fragments comprising fragment blocks corresponding to data blocks in the data file, and some of which original erasure-coded fragments may have become corrupted, and the instructions, when executed by a computer, cause the computer to:
select a data block of a plurality of data blocks to be recovered;
select a first set of m fragments from the stored fragments;
select a fragment block from each fragment of the first set of m fragments, the fragment block corresponding to the selected data block;
construct a first candidate data block based on the selected fragment blocks of the first set of m fragments;
select a second set of m fragments from the stored fragments, the second set of m fragments comprising at least one fragment not previously selected;
select a fragment block from each fragment of the second set of m fragments, the fragment block corresponding to the selected data block;
construct a second candidate data block based on the selected fragment blocks of the second set of m fragments;
compare the second candidate data block to the first candidate data block;
if the second candidate data block matches the first candidate data block, then save at least one of the second candidate data block or the first candidate data block as a recovered first data block; and
if the second candidate data block does not match the first candidate data block then
select a third set of m fragments from the stored fragments, the third set being different from each previous set by at least one fragment,
select a fragment block from each fragment of the third set of fragments, the fragment block corresponding to the selected data block,
construct a third candidate data block based on the selected fragment blocks of the third set of fragments,
compare the third candidate data block to the first and second candidate data block, and
if the third candidate data block matches either the first candidate data block or the second candidate data block then to save at least one of the third candidate data block or the matching first or second candidate data block as a recovered first data block.

10. The non-transitory computer-readable storage medium of claim 9, wherein the computer-readable storage medium has further computer-executable instructions stored thereupon which, when executed by the computer, cause the computer, if the third candidate data block does not match either the first candidate data block or the second candidate data block, to:
(a) select a next set of m fragments from the stored fragments, the next set being different from each previous set by at least one fragment;
(b) select a fragment block from each fragment of the next set of m fragments, the fragment block corresponding to the selected data block;
(c) construct a next candidate data block based on the selected fragment blocks of the next set of m fragments;
(d) compare the next candidate data block to at least one of the candidate data blocks which was previously constructed; and
(e) if the next candidate data block matches any candidate data block which was previously constructed then to save at least one of the next candidate data block, or the matching candidate data block which was previously constructed, as a recovered first data block.

11. The non-transitory computer-readable storage medium of claim 10, wherein the computer-readable storage medium has further computer-executable instructions stored thereupon which, when executed by the computer, cause the computer, if the next candidate data block does not match any candidate data block which was previously constructed, to repeat operations (a)-(e) until a predetermined criteria is met.

12. The non-transitory computer-readable storage medium of claim 11 wherein the predetermined criteria is at least one of: the next candidate data block matches one of the candidate data blocks which was previously constructed, all possible sets of m fragments have been used to produce candidate data blocks, or a predetermined number of candidate data blocks have been generated and no two of the generated candidate data blocks are matching.

13. The non-transitory computer-readable storage medium of claim 10, wherein the computer-readable storage medium has further computer-executable instructions stored thereupon which, when executed by the computer, cause the computer, if any candidate data block has been saved as the recovered first data block, to:
select a second data block of the plurality of data blocks to be recovered;
select a first set of m fragments from the stored fragments;
select a fragment block from each fragment of the first set of m fragments, the fragment block corresponding to the selected second data block;
construct a first candidate data block based on the selected fragment blocks of the first set of fragments;
select a second set of m fragments from the stored fragments, the second set comprising at least one fragment not previously selected;
select a fragment block from each fragment of the second set of m fragments, the fragment block corresponding to the selected second data block;

construct a second candidate data block based on the selected fragment blocks of the second set of m fragments;

compare the second candidate data block to the first candidate data block; and if the second candidate data block matches the first candidate data block then to save at least one of the second candidate data block or the first candidate data block as a recovered second data block.

14. The non-transitory computer-readable storage medium of claim 10, wherein the computer-readable storage medium has further computer-executable instructions stored thereupon which, when executed by the computer, cause the computer, if the second candidate data block does not match the first candidate data block, to:

select a third set of m fragments from the stored fragments, the third set being different from each previous set by at least one fragment;

select a fragment block from each fragment of the third set of m fragments, the fragment block corresponding to the selected data block;

construct a third candidate data block based on the selected fragment blocks of the third set of m fragments;

compare the third candidate data block to the first and second candidate data block; and if the third candidate data block matches either the first candidate data block or the second candidate data block then to save at least one of the third candidate data block or the matching first or second candidate data block as a recovered second data block.

15. The non-transitory computer-readable storage medium of claim 10, wherein the computer-readable storage medium has further computer-executable instructions stored thereupon which, when executed by the computer, cause the computer, if all of the data blocks of the data file have been recovered, to construct the data file from the recovered data blocks.

16. The non-transitory computer-readable storage medium of claim 10, wherein the computer-readable storage medium has further computer-executable instructions stored thereupon which, when executed by the computer, cause the computer, to:

generate a new set of erasure-coded fragments based on the constructed data file; and one of: (i) replace at least some of the stored fragments with erasure-coded fragments from the new set; (ii) compare at least some of the stored fragments with corresponding new erasure-coded fragments and replace any different stored fragment with a corresponding erasure-coded fragment from the new set; or (iii) replace any stored fragments which are not in one of the selected sets with corresponding new erasure-coded fragments.

17. A computing system for storing data files as a plurality of erasure-coded data fragments created using an m-of-n erasure coding scheme, and for recovering the data files when an excessive number of the plurality of erasure-coded fragments has become corrupted, the computing system comprising:

a plurality of storage servers configured to store and retrieve erasure-coded data fragments for a data file using an m-of-n erasure coding scheme;

a network; and a client access server, functionally connected to the plurality of storage servers via the network, and configured to receive an original data file, to generate the plurality of erasure-coded data fragments for the data file using the m-of-n erasure coding scheme, and to distribute the erasure-coded data fragments to the plurality of servers, the erasure-coded data fragments having data fragment blocks corresponding to data blocks in the original data file; and wherein the client access server is further configured to receive a request for the original data file and, in response to the request, to retrieve the erasure-coded data fragments from the plurality of storage servers to construct a candidate data file, to test the candidate data file for validity and, if the candidate data file is valid, to send the candidate data file as the requested original data file; and wherein the client access server is further configured, if the erasure-coded data fragments are too corrupted to construct a valid candidate data file, to select fragment data blocks for a data block from the erasure-coded data fragments, to create candidate data blocks from the selected fragment data blocks, to test the candidate data blocks for validity, to combine the valid candidate data blocks to construct a candidate data file, and to send the candidate data file as the requested original data file.

18. The computing system of claim 17 wherein the client access server is further configured to select fragment data blocks for a data block from the data fragments by selecting a first set of m fragments from the stored fragments, selecting a fragment block from each fragment of the first set of m fragments, the fragment block corresponding to the selected data block, selecting a second set of m fragments from the stored fragments, the second set of m fragments comprising at least one fragment not previously selected, and selecting a fragment block from each fragment of the second set of m fragments, the fragment block corresponding to the selected data block.

19. The computing system of claim 18 wherein the client access server is further configured to create candidate data blocks from the selected fragment data blocks by constructing a first candidate data block based on the selected fragment blocks of the first set of m fragments, and constructing a second candidate data block based on the selected fragment blocks of the second set of m fragments.

20. The computing system of claim 19 wherein the client access server is further configured to test the candidate data blocks for validity by comparing the second candidate data block to the first candidate data block, and if the second candidate data block matches the first candidate data block, then saving at least one of the second candidate data block or the first candidate data block as a recovered first data block.

21. The computing system of claim 20 wherein the client access server is further configured to, if the second candidate data block does not match the first candidate data block, select a third set of m fragments from the stored fragments, the third set being different from each previous set by at least one fragment, select a fragment block from each fragment of the third set of fragments, the fragment block corresponding to the selected data block, construct a third candidate data block based on the selected fragment blocks of the third set of fragments, compare the third candidate data block to the first and second candidate data block, and if the third candidate data block matches either the first candidate data block or the second candidate data block then save at least one of the third candidate data block or the matching first or second candidate data block as a recovered first data block.

22. The computing system of claim 21 wherein the client access server is further configured to, if the third candidate data block does not match either the first candidate data block or the second candidate data block, select a next set of m fragments from the stored fragments, the next set being different from each previous set by at least one fragment, select a fragment block from each fragment of the next set of m fragments, the fragment block corresponding to the selected data block, construct a next candidate data block based on the selected fragment blocks of the next set of m fragments, compare the next candidate data block to at least one of the candidate data blocks which was previously constructed, and if the next candidate data block matches any candidate data block which was previously constructed then save at least one of the next candidate data block or the matching first or second candidate data block as a recovered first data block.

* * * * *